(12) United States Patent
Kim

(10) Patent No.: US 6,409,828 B1
(45) Date of Patent: Jun. 25, 2002

(54) METHOD AND APPARATUS FOR ACHIEVING A DESIRED THICKNESS PROFILE IN A FLOW-FLANGE REACTOR

(75) Inventor: Tae S. Kim, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 1610 days.

(21) Appl. No.: 08/526,828

(22) Filed: Sep. 12, 1995

Related U.S. Application Data

(62) Division of application No. 08/332,192, filed on Oct. 31, 1994, now abandoned.

(51) Int. Cl.⁷ ............................................. C30B 25/16
(52) U.S. Cl. .............................. 117/85; 117/86; 438/5; 438/7; 438/265; 438/267; 438/286; 438/293
(58) Field of Search ................................ 437/105, 107, 437/126, 133; 118/728, 723 MP; 117/85, 86; 438/265, 267, 286, 293, 5, 7

(56) References Cited

U.S. PATENT DOCUMENTS 4,579,623 A * 4/1986 Suzuki et al. ............... 118/728
5,463,977 A * 11/1995 Manada et al. ............... 117/86
5,472,507 A * 12/1995 Yamaguchi .......... 118/723 MP

OTHER PUBLICATIONS

Emcore Technical update Dec. 1991.*

* cited by examiner

Primary Examiner—Robert Kunemund
(74) Attorney, Agent, or Firm—W. James Brady; Frederick J. Telecky, Jr.

(57) ABSTRACT

A method and apparatus are disclosed for achieving a desired thickness profile in a semiconductor device (44) using a flow-flange reactor (10), by adjusting input flow ratios in the flow-flange (12) of the reactor (10). A target thickness profile is established. A first set of optimum input flow ratios are then determined in response to the target thickness profile, based upon a first plurality of sample thickness profiles and a first plurality of sets of sample input flow ratios, wherein each of the sample thickness profiles corresponds to one of the first plurality of sets of sample input flow ratios. The input flow ratios of the reactor (10) are then adjusted in response to the first optimum set of input flow ratios.

14 Claims, 3 Drawing Sheets

METHOD AND APPARATUS FOR ACHIEVING A DESIRED THICKNESS PROFILE IN A FLOW-FLANGE REACTOR

This is a division of application Ser. No. 08/332,192 filed Oct. 31, 1994 now abandoned.

CROSS-REFERENCE TO RELATED APPLICATIONS

This application is related to U.S. application Ser. No. 08,33,844, filed on Oct. 31, 1994 by Tae S. Kim and entitled "Method and Apparatus For Increasing Doping Uniformity in a Flow-Flange Reactor", now abandoned.

TECHNICAL FIELD OF THE INVENTION

This invention relates generally to organometallic vapor phase epitaxy and more particularly to an apparatus and method for achieving a desired thickness profile in a semiconductor device using a flow-flange reactor.

BACKGROUND OF THE INVENTION

A commonly used epitaxial growth technique for gallium arsenide semiconductors is organometallic vapor phase epitaxy (OMVPE). The thickness profile of an epitaxial layer is an important factor to control during the OMVPE process. Often, an epitaxial layer with uniform thickness is desirable. In some circumstances, however, such as in fabricating a quantum well laser, a non-uniform thickness profile is desirable.

Reactor designs have been developed to aid in achieving the desired thickness profile. One widely used reactor is known as a flow-flange reactor. An example of a flow-flange reactor is the GS3200 manufactured by EMCORE of Somerset, New Jersey. In the EMCORE flow-flange configuration, the flow-flange of the growth chamber has three divided concentric sections, sometimes called gas dispersing rings, through which source gases are injected and dispersed. The three gas dispersing rings are also divided in half at the center such that Group III and Group V source gases may be separately injected. Typically, the Group III and dopant source gases are injected into one side of the three sections and Group V source gases are injected into the other side. The ratios of input flows of the Group III source gases on the three gas dispersing rings normally determine the thickness profile on the layer being epitaxially grown.

The standard procedure for adjusting the flow ratios of the Group III source gases to achieve a desired thickness profile is typically based upon trial and error and can become a costly process. With the standard procedure, an empirically known desirable set of input flow ratios is normally chosen. After analyzing results achieved with the empirically known set of input flow ratios, the set of ratios are then fine tuned until the desired thickness profile is achieved. It often takes ten or more iterations to achieve the desired thickness profile even when the initial settings achieve a thickness profile near the desired thickness profile.

In current practice, a fixed input flow ratio is often used for growing each layer on a wafer. One limitation of using a fixed input flow ratio is that the thickness profile may not be maintained when different growth conditions or source gases are used. Different source gases are normally used when different materials are to be grown or if unique properties of source materials are required. Because many different source gases and growth conditions are used for the growth of device structures, the current practice of using a fixed input flow ratio is inadequate. Moreover, different thickness profiles may be desirable for different layers of a multi-layer device structure such as in a quantum well laser.

SUMMARY OF THE INVENTION

Accordingly, a need has arisen for a method and apparatus for adjusting input flow ratios in a flow-flange reactor to achieve a desired thickness profile. A need has also arisen for a method and apparatus allowing different thickness profiles to be used for different layers of a semiconductor device.

One aspect of the invention is a method for adjusting input flow ratios in a flow-flange reactor to achieve a desired thickness profile. A target thickness profile is established. A first set of optimum input flow ratios is then determined in response to the target thickness profile. The first set of optimum input flow ratios is based upon a first plurality of sample thickness profiles and a first plurality of sets of sample input flow ratios, wherein each of the sample thickness profiles corresponds to one set of the first plurality of sets of sample input flow ratios. The input flow ratios of the reactor are then adjusted in response to the first set of optimum input flow ratios.

One important technical advantage of the present invention is that the disclosed method and apparatus allow the determination of a set of optimum input flow ratios with a smaller number of trials than with the conventional trial and error method. The present invention thus saves time and money in developing a manufacturing process for a specific device. Another important advantage of the present invention is that a set of optimum input flow ratios may be determined for each layer in a multiple layer device. By adjusting input flow ratios for each layer of the device, the desired thickness profile can be achieved for each level and varying thickness profiles can be used for different levels.

BRIEF DESCRIPTION OF THE DRAWINGS

For a more complete understanding of the present invention and the advantages thereof, reference is now made to the following descriptions taken in conjunction with the accompanying drawings in which.

DETAILED DESCRIPTION OF THE INVENTION

The present invention and its advantages are best understood by referring to FIGS. 1 through 5 of the drawings, like numerals being used for like and corresponding parts of the various drawings.

Figure 1:
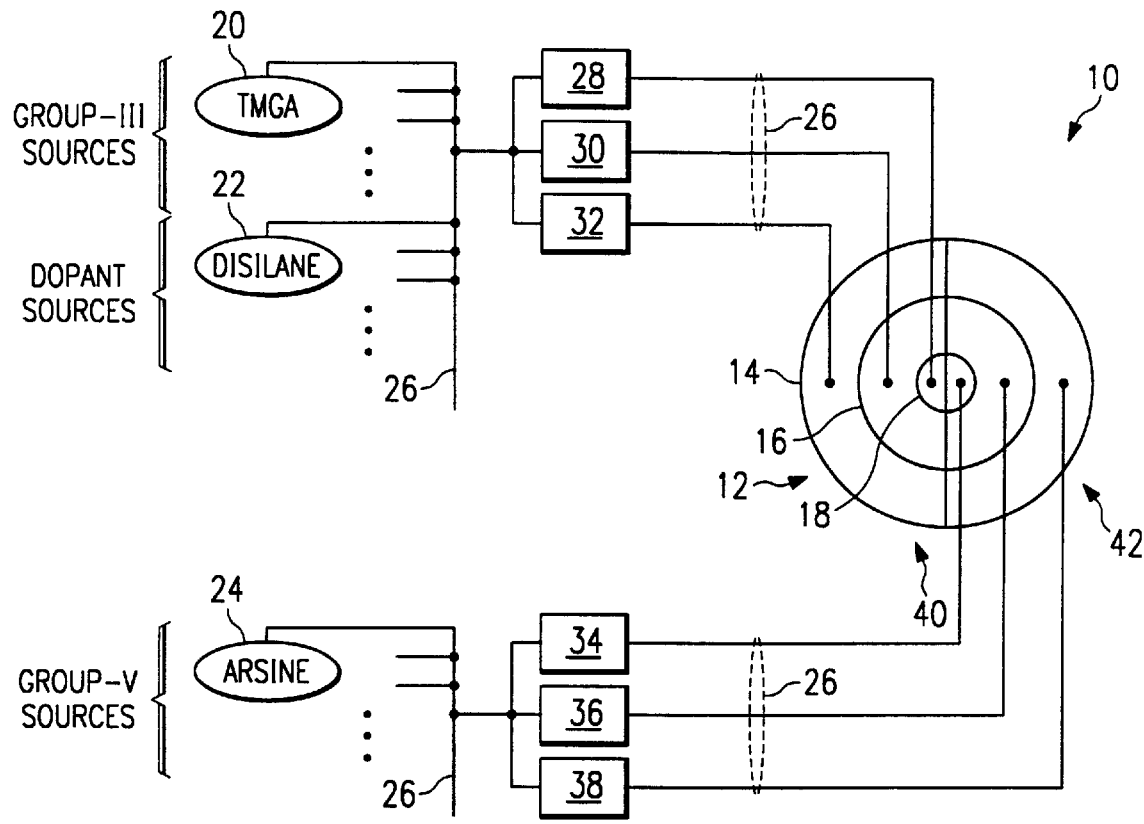
FIG. 1 illustrates an existing flow-flange reactor.

FIG. 1 illustrates an existing flow-flange reactor 10. Flow-flange reactor 10 comprises flow-flange 12, gas sources 20, 22, 24, pipes 26 and gas controls 28, 30, 32, 34, 36 and 38. Flow-flange reactor 10 will be used as an example to illustrate the methods of the present invention. The invention, however, is not limited to use with flow-flange reactor 10; the invention may be used with any flow-flange reactor.

Flow-flange 12 may be divided into a plurality of sections. Each section may be further subdivided into a plurality of subsections. In the embodiment illustrated in FIG. 1, flow-flange 12 is divided into three sections and each section is further subdivided into two subsections.

The three sections of the embodiment of flow-flange 12 illustrated in FIG. 1, which may also be referred to as gas dispersing rings, include outer ring 14, middle ring 16 and inner ring 18. Each ring or section is further subdivided into two subsections, denoted as first half 40 and second half 42.

The rates of gas flow into first half 40 and second half 42 of outer ring 14, middle ring 16 and inner ring 18 are controlled by gas controls 28, 30, 32, 34, 36 and 38. Gas controls 28, 30, 32, 34, 36 and 38 may be, for example, manually controlled metering valves or electronically controlled mass-flow controllers. Gas controls 28, 30 and 32 control the flow rate of gas to first half 40 of inner ring 18, middle ring 16, and outer ring 14, respectively. Gas controls 34, 36 and 38 control the flow rate of gases to second half 42 of inner ring 18, middle ring 16 and outer ring 14, respectively.

Flow-flange reactor 10 may also include a plurality of group III gas sources 20, a plurality of dopant gas sources 22 and a plurality of group V gas sources 24. Group III gas sources may include, for example, sources of trimethyl gallium and trimethyl aluminum. Group V gas sources 24 may include, for example, sources of arsine. Dopant gas sources 22 may include, for example, sources of disilane. Other types of gas may be supplied by group III gas sources 20, dopant gas sources 22 and group V gas sources 24 without departing from the scope and teachings of the present invention. In addition, only one gas source of each type could be used.

Pipes 26 connect gas sources 20, 22 and 24 to gas controls 28, 30, 32, 34, 36 and 38. Pipes 26 also connect gas controls 28, 30, 32, 34, 36 and 38 to first half 40 of inner ring 18, middle ring 16, and outer ring 14 as well as to second half 42 of inner ring 18, middle ring 16 and outer ring 14. The embodiment illustrated in FIG. 1 has a single pipe 26 connecting gas controls 28, 30 and 32 to group III gas sources 20 and dopant gas sources 22 and a single pipe connecting gas controls 34, 36 and 38 to group V gas sources 24. Alternatively, each gas control 28, 30, 32, 34, 36 and 38 may be directly connected by a pipe 26 to any one or more group III gas sources 20, dopant gas sources 22 or group V gas sources 24. In other words, each gas control 28, 30, 32, 34, 36 and 38 may have its own pipe 26 connecting that gas control to one or more of the gas sources 20, 22 and 24.

Figure 2:
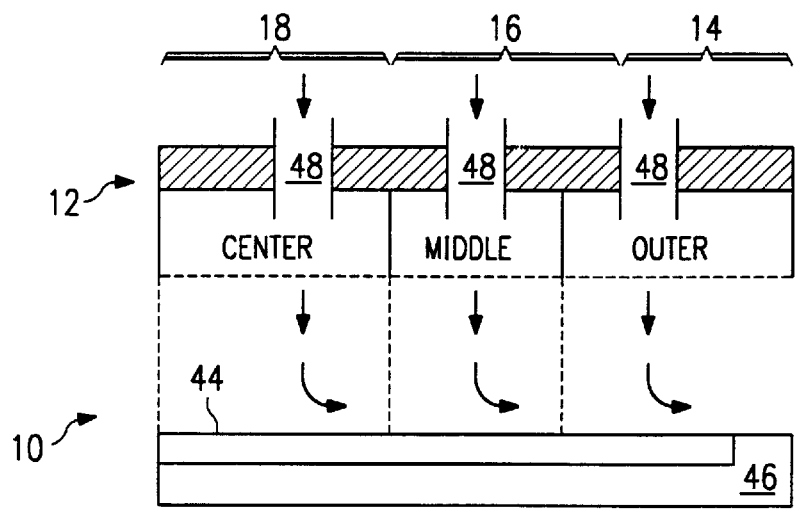
FIG. 2 illustrates a side view of a portion of the flow-flange reactor of FIG. 1.

FIG. 2 illustrates a cutaway side view of a portion of flow-flange reactor 10. This figure illustrates how gases flow through flow-flange 12 and over the surface of wafer 44. Wafer 44 is coupled to wafer carrier 46. During the growth process, gases flow through openings 48 in flow-flange 12 in the general direction illustrated by the arrows and over the surface of wafer 44.

Figure 3:
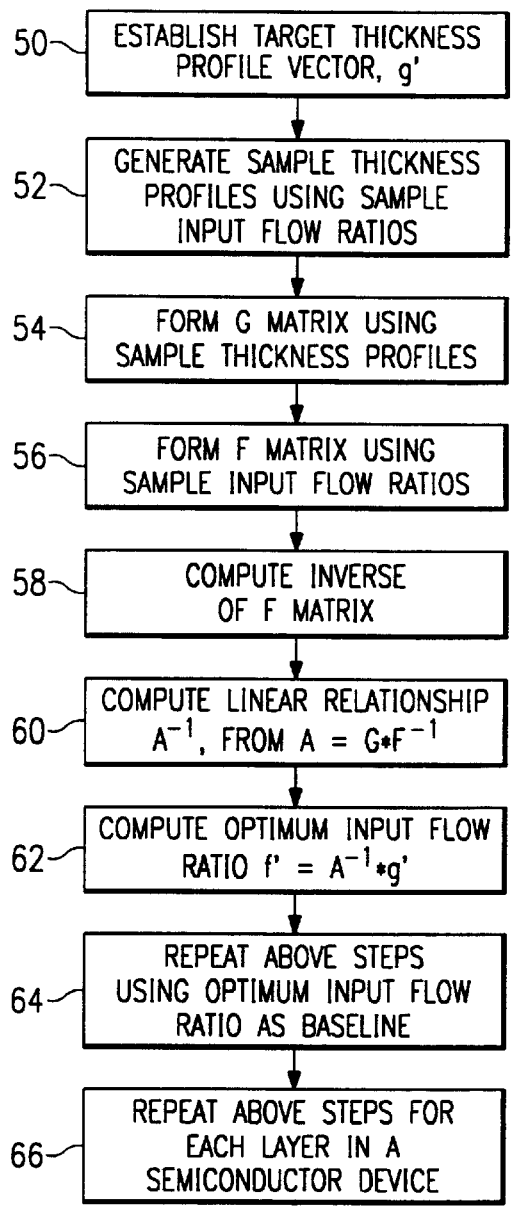
FIG. 3 illustrates a flow chart of the various steps of a preferred method of the present invention.

FIG. 3 is a flow chart illustrating the steps of a preferred method of the present invention. Experimental results indicate that a linear model may be used to efficiently achieve a desired thickness profile. These experimental results indicate that a linear model is accurate enough to achieve two percent thickness uniformity. The method illustrated in FIG. 3 thus describes how a linear model may be used to determine optimal input flow ratios.

The input flow ratios to be adjusted are those for the group III gas sources. Input flow ratios between group V and group III gas sources and between group V gas sources alone have negligible effects on the thickness profile of a device layer. Input flow ratios between group III gas sources, however, substantially affect the thickness profile of the device.

Figure 4:
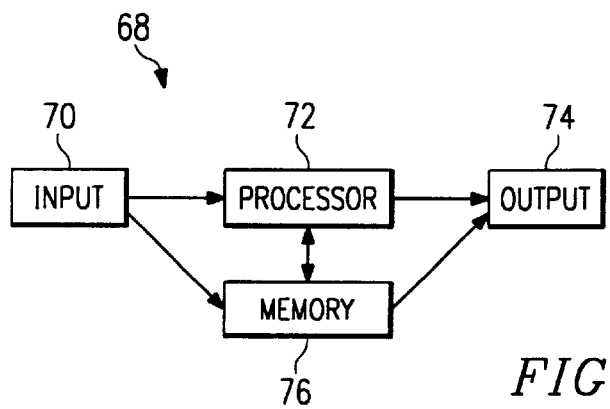
FIG. 4 illustrates a block diagram of a general purpose computer that may be used with the method shown in FIG. 3.

The method of the present invention may be performed, for example, on a general purpose digital computer having similar functional capabilities. FIG. 4 illustrates a block diagram of a general purpose digital computer 68 that may be used to accomplish the steps of the present invention. Computer 68 comprises input circuitry 70, processor 72, output circuitry 74 and memory 76. Input circuitry 70 may be coupled to processor 72 and memory 76. Processor 72 may also be coupled to memory 76 and output circuitry 74. Output circuitry 74 may also be coupled to memory 76. Processor 72 and memory 76 may be operable to receive data received from using input circuitry 70. Processor 72 may process data received from input circuitry 70 and/or data stored in memory 76. Processor 72 may also be operable to output data using output circuitry 74.

To perform the method of the present invention on computer 68, data may be stored in memory 76, the data representing the various numerical quantities described below. Processor 72 may be used to perform all calculations described in the method and data may be stored in memory 76, the data representing the result of the calculations. Data may also be output using output circuitry 74.

In step 50, a target thickness profile can be established. The target thickness profile vector, g', comprises an N×1 vector representing the thickness of N points in the layer to be epitaxially grown. The quantity, N, may be, for example, the number of different sections in the flow-flange. A flow-flange with N different sections will normally have N different input flow ratios for group III gas sources.

In step 52, sample thickness profiles may be generated using sets of sample input flow ratios. Ordinarily, N sets of sample input flow ratios will be used to generate N sample thickness profiles. The N sets of sample input flow ratios will normally be mutually independent.

The method then proceeds to step 54 where a G matrix may be formed using the sample thickness profiles. Each column of the G matrix comprises an N×1 vector representing the thickness of N points of a sample generated using one of the sets of sample input flow ratios.

Continuing to step 56, the F matrix can be formed using the sets of sample input flow ratios. Each column of the F matrix may comprise an N×1 vector representing one of the sets of sample input flow ratios from step 52. The columns of the F matrix will ordinarily be arranged such that the sets of sample input flow ratios are arranged in the same order as the sample thickness profiles used to form the G matrix. For example, if a given sample thickness profile is placed in column 3 of the G matrix, then the vector representing the set of sample input flow ratios that was used to generate the sample thickness profile will normally be placed in column 3 of the F matrix.

Because the method of the present invention employs a linear model, the G matrix and F matrix may be related by the following equation:

$$G = A * F \tag{1}$$

The A matrix may represent a linear relationship between the F and G matrices. Elementary linear algebra may then be used to demonstrate that an A matrix may be calculated using the following equation, where the A matrix may be used to compute a linear relationship between the sample thickness profiles and sets of sample input flow ratios:

$$A = G * F^{-1} \quad (2)$$

In step 58, the inverse of the F matrix can be computed using the F matrix. The inverse of the F matrix can then be used to compute the A matrix.

In step 60, a linear relationship between the sample thickness profiles and sets of sample input flow ratios may be computed using Equation 2. The linear relationship can be derived from the A matrix resulting from the application of Equation 2. The inverse of this matrix represents a linear relationship between the sets of sample input flow ratios and sample thickness profiles such that when the linear relationship, $A^{-1}$, is multiplied by a target thickness profile, a vector representing an optimum set of input flow ratios results.

Thus, in step 62, the set of optimum input flow ratios, vector f', can be computed using the following equation:

$$f' = A^{-1} * g' \quad (3)$$

As discussed above, g' represents a target thickness profile.

This set of optimum input flow ratios may now be used for growing the layer with the target thickness profile in the flow-flange reactor. In step 64, steps 50 through 62 may be repeated using the optimum input flow ratio, f' as a baseline. For example, the thickness profile produced using the set of optimum input flow ratios computed using the above method may deviate slightly from the target thickness profile. By repeating the above steps, using the set of optimum input flow ratios as a baseline, a new optimum input flow ratio vector may be computed, so as to finely tune the process to achieve the target thickness profile.

Growth conditions may change for a given layer of the device. In addition, the desired target thickness profile may vary for each layer of a device. Accordingly, the above method may be repeated, as in step 66, for each layer of a semiconductor device. In other words, the set of optimal input flow ratios for one layer of a semiconductor device may differ from the set of optimal input flow ratios for other layers in the device. Therefore, during the growth process, the flow ratios may be adjusted at the beginning of the fabrication of each layer.

Figure 5:
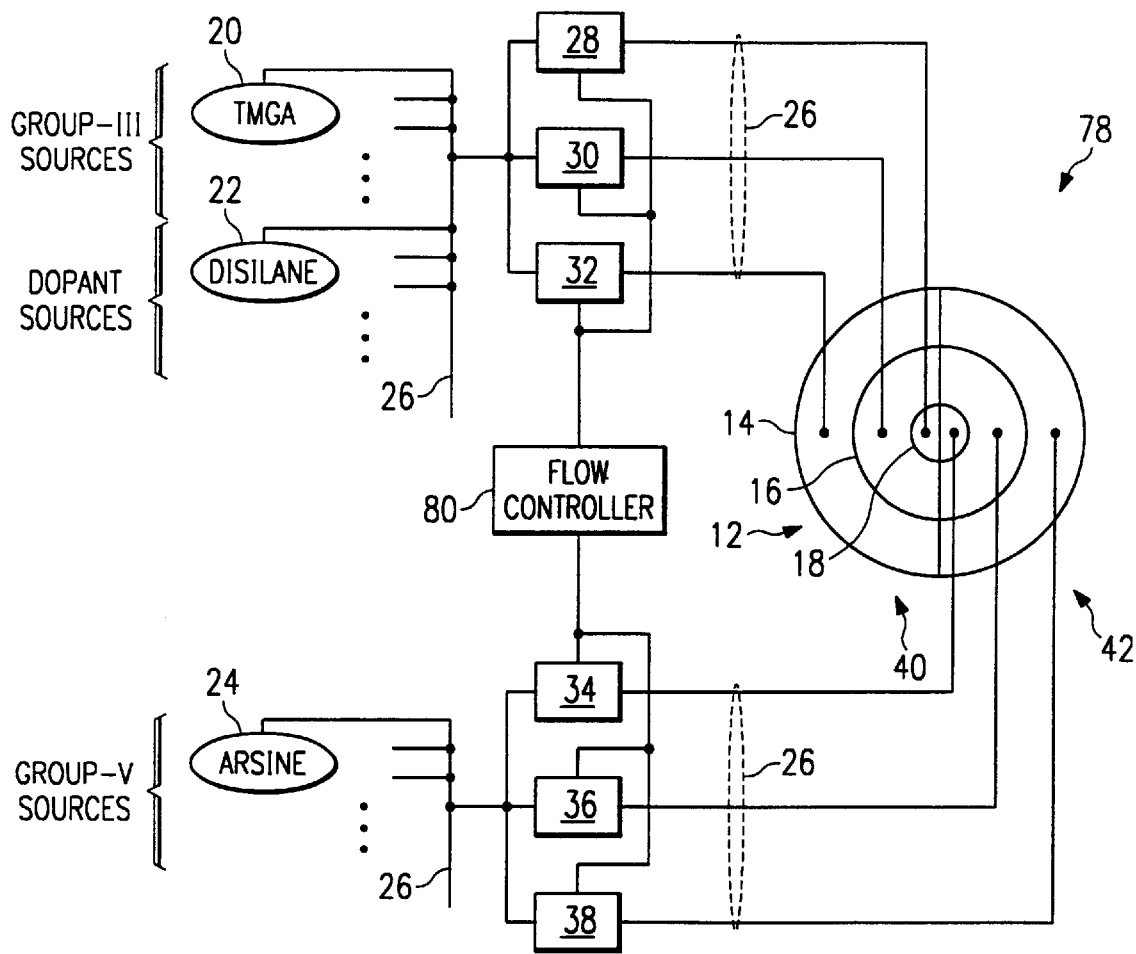
FIG. 5 illustrates an embodiment of a flow-flange reactor constructed in accordance with the teachings of the present invention.

FIG. 5 illustrates an embodiment of an improved flow-flange reactor 78 constructed in accordance with the teachings of the present invention. Many elements of flow-flange reactor 78 have been previously described. Flow-flange reactor 78, however, further comprises flow controller 80. Flow controller 80 couples to gas controls 28, 30, 32, 34, 36 and 38. Flow controller 80 is preferably operable to receive a first target thickness profile and determine a first set of optimum input flow ratios in response to the first target thickness profile, based upon a first plurality of sample thickness profiles and a first plurality of sets of sample input flow ratios. Flow controller 80 may be further operable to adjust gas controls 28, 30, 32, 34, 36 and 38 in response to the first set of optimum input flow ratios. Flow controller 80 may also receive a second target thickness profile and determine a second set of optimum input flow ratios in response to the second target thickness profile, based upon a second plurality of sample thickness profiles and a second plurality of sets of sample input flow ratios. Flow controller 80 may then adjust gas controls 28, 30, 32, 34, 36 and 38 in response to the second set of optimum input flow ratios.

Using equations 1–3, a plurality of sets of optimum input flow ratios may be determined and stored in flow controller 80 for use in epitaxially growing a multi-layer semiconductor device. A different set of optimum input flow ratios could be used for each layer of the device. As described above, the set of input flow ratios will normally comprise input flow ratios for group III gas sources. By adding flow controller 80, therefore, flow-flange reactor 78 allows the set of input flow ratios to be adjusted in real time for each layer of a multi-layer device. Thus, as indicated by FIG. 5, the flow control 80 will operate without a feedback connection from the flow-flange reactor 78 and therefore operates as an open-loop controller.

Although the present invention and its advantages have been described in detail, it should be understood that the various changes, substitutions and alterations can be made therein without departing from the spirit and scope of the invention as defined by the appended claims.

What is claimed is:

1. A method for adjusting gas flow in a flow-flange reactor to achieve a desired thickness profile, comprising the steps of:
   establishing a target thickness profile;
   determining a first set of optimum input-flow ratios in response to said target thickness profile, based upon a first plurality of sample thickness profiles and a first plurality of sets of sample input-flow ratios, each of said sample thickness profiles corresponding to one set of said first plurality of sets of sample input-flow ratios;
   calculating from said input-flow ratios a gas flow for each of a plurality of gases supplied to said reactor; and
   open-loop control adjusting gas flow to said reactor for each of said plurality of gases to produce said calculated gas flow.

2. The method of claim 1, said determining step further comprising the steps of:
   defining a linear relationship between said first sample thickness profiles and said first sets of sample input-flow ratios; and
   calculating said first set of optimum input-flow ratios in response to said target thickness profile and said linear relationship.

3. The method of claim 2 wherein said linear relationship comprises an N×N matrix, where N is the number of gas-dispersing rings in the flow-flange of said reactor.

4. The method of claim 3 wherein said matrix comprises the inverse of the product of a second matrix and a third matrix, wherein the columns of the second matrix comprise said first plurality of sample thickness profiles and wherein the third matrix is the inverse of a fourth matrix whose columns comprise said first plurality of sets of sample input-flow ratios.

5. The method of claim 1, further comprising the step of:
   repeating said establishing, determining, and adjusting steps for each layer of a multi-layer semiconductor device.

6. The method of claim 1, wherein said adjusting step comprises adjusting the input-flow ratios of said reactor to be substantially equal to said first set of optimum input-flow ratios.

7. The method of claim 1, further comprising the step of:
   repeating said determining and said adjusting steps using a second plurality of sample thickness profiles corresponding to a second plurality of sets of sample input-flow ratios, wherein each set of said second plurality of sets of sample input-flow ratios is chosen in relation to said first set of optimum input-flow ratios.

8. The method of claim 7, further comprising the step of
repeating said establishing, determining, adjusting, and repeating steps for each layer of a multi-layer semiconductor device.

9. The method of claim 8, said determining step further comprising the steps of:
defining a linear relationship between said first sample thickness profiles and said first sets of sample input-flow ratios; and
calculating said first set of optimum input-flow ratios in response to said target thickness profile and said linear relationship.

10. A method for determining an input-flow ratio in a flow-flange reactor to achieve a desired thickness profile on a digital computer, comprising the steps of:
establishing a target thickness profile and storing data representing said target thickness profile in memory;
calculating a first set of optimum input-flow ratios in response to said target thickness profile, said input-flow ratios being usable to calculate each of a plurality of gas flows to said reactor for producing said desired thickness profile in an open-loop control process, said input-flow ratios being based upon data stored in said memory, said data representing a first plurality of sample thickness profiles and a first plurality of sets of sample input-flow ratios, each of said sample thickness profiles corresponding to one set of said first plurality of sets of sample input-flow ratios; and
storing data representing said first set of optimum input-flow ratios in said memory.

11. The method of claim 10, said calculating step further comprising the steps of:
storing data in said memory defining a linear relationship between said data representing said first sample thickness profiles and said data representing said first set of sample input-flow ratios; and
calculating said first set of optimum input-flow ratios in response to said target thickness profile and said linear relationship.

12. The method of claim 10, further comprising the step of:
repeating said establishing, calculating, and storing steps for each layer of a multi-layer semiconductor device.

13. The method of claim 10, further comprising the step of:
repeating said calculating and said storing steps using data representing a second plurality of sample input-flow ratios and a second plurality of sets of sample thickness profiles corresponding to said second plurality of sets of sample input-flow ratios, wherein each set of said second plurality of sample input-flow ratios is chosen in relation to said first optimum input-flow ratio.

14. The method of claim 11 wherein said linear relationship comprises data representing an N×N matrix, where N is the number of gas-dispersing rings in the flow-flange of said reactor.

* * * * *